(12) United States Patent
Chen et al.

(10) Patent No.: US 11,637,060 B2
(45) Date of Patent: Apr. 25, 2023

(54) WIRING BOARD AND METHOD OF MANUFACTURING THE SAME

(71) Applicant: Unimicron Technology Corp., Taoyuan (TW)

(72) Inventors: Chun-Hao Chen, Taoyuan (TW); Chia-Lung Lin, Taoyuan (TW); Chien-Hsiang Chou, Taoyuan (TW); Yi-Lin Chiang, Taoyuan (TW); Chien-Chen Lin, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/654,405

(22) Filed: Mar. 11, 2022

(65) Prior Publication Data

US 2022/0199513 A1     Jun. 23, 2022

Related U.S. Application Data

(60) Continuation-in-part of application No. 17/234,826, filed on Apr. 20, 2021, now Pat. No. 11,315,865.
(Continued)

(30) Foreign Application Priority Data

Jul. 18, 2019   (TW) ................................ 108125490
Feb. 17, 2022   (TW) ................................ 111105897

(51) Int. Cl.
*H05K 1/11*      (2006.01)
*H05K 3/40*      (2006.01)
(Continued)

(52) U.S. Cl.
CPC .... *H01L 23/49838* (2013.01); *H01L 21/4857* (2013.01); *H01L 23/49822* (2013.01);
(Continued)

(58) Field of Classification Search
CPC .................. H05K 1/11–119; H05K 3/40–4015
See application file for complete search history.

(56) References Cited

U.S. PATENT DOCUMENTS

| | | |
|---|---|---|
| 5,046,238 A | 9/1991 | Daigle et al. |
| 5,310,966 A | 5/1994 | Iida et al. |

(Continued)

FOREIGN PATENT DOCUMENTS

| | | |
|---|---|---|
| TW | 466895 B | 12/2001 |
| TW | 573448 B | 1/2004 |

(Continued)

*Primary Examiner* — Jeremy C Norris
(74) *Attorney, Agent, or Firm* — CKC & Partners Co., LLC

(57) ABSTRACT

A wiring board includes an insulating layer, a wiring layer and a plurality of conductive columns. The insulating layer has a first surface and a second surface opposite to the first surface. The wiring layer is disposed in the insulating layer and has a third surface and a fourth surface opposite to the third surface. The insulating layer covers the third surface, and the second surface of the insulating layer is flush with the fourth surface of the wiring layer. The conductive columns are disposed in the insulating layer and connected to the wiring layer. The conductive columns extend from the third surface of the wiring layer to the first surface of the insulating layer, and protrude from the first surface.

19 Claims, 15 Drawing Sheets

Related U.S. Application Data which is a division of application No. 16/579,812, filed on Sep. 23, 2019, now Pat. No. 11,011,458.

(51) Int. Cl.
  *H01L 23/498* (2006.01)
  *H01L 21/48* (2006.01)
  *H05K 3/06* (2006.01)

(52) U.S. Cl.
  CPC .............. *H05K 1/11* (2013.01); *H05K 3/06* (2013.01); *H05K 3/40* (2013.01)

(56) References Cited

U.S. PATENT DOCUMENTS

| | | |
|---|---|---|
| 6,902,660 B2 | 6/2005 | Lee et al. |
| 7,093,356 B2 | 8/2006 | Imafuji et al. |
| 7,169,707 B2 | 1/2007 | Maeng et al. |
| 7,222,421 B2 | 5/2007 | Nakamura |
| 7,716,826 B2 | 5/2010 | Nakamura |
| 7,882,626 B2 | 2/2011 | Murayama et al. |
| 7,971,352 B2 | 7/2011 | Okabe et al. |
| 8,344,261 B2 | 1/2013 | Lee et al. |
| 8,354,598 B2 | 1/2013 | Liu |
| 8,549,745 B2 | 10/2013 | Kung et al. |
| 11,011,458 B2 | 5/2021 | Lin |
| 2014/0000952 A1 | 1/2014 | Ko |
| 2017/0338174 A1 | 11/2017 | Hu et al. |

FOREIGN PATENT DOCUMENTS

| | | |
|---|---|---|
| TW | I393233 B | 4/2013 |
| TW | I728410 B | 5/2021 |

WIRING BOARD AND METHOD OF MANUFACTURING THE SAME

CROSS-REFERENCE TO RELATED APPLICATION

This application claims priority to Taiwan Application Serial Number 111105897, filed Feb. 17, 2022 and is a Continuation-in-part of U.S. application Ser. No. 17/234,826, filed on Apr. 20, 2021, which is a divisional of U.S. application Ser. No. 16/579,812, filed on Sep. 23, 2019 and issued on May 18, 2021 (U.S. Pat. No. 11,011,458) and claims priority to Taiwan application serial number 108125490, filed on Jul. 18, 2019, all of which are herein incorporated by reference in their entireties.

BACKGROUND

Technical Field

The present disclosure relates to a wiring board and a method of manufacturing the same. More particularly, the present disclosure relates to a wiring board having a plurality of conductive columns protruding from the insulating layer and a method of manufacturing the preceding wiring board.

Description of Related Art

Some of existing wiring boards have a plurality of conductive blind vias, which are substantially conductive columns, where some conductive blind via is connected to two pads. The width of each of the pads is usually greater than the width (i.e., diameter) of the conductive blind via to make sure that the conductive blind via is able to connect the pads due to the limitation of alignment capability of a conventional manufacturing machine. Hence, the pad usually protrudes from the sidewall of the conductive blind via, so that each of the pads has a larger size and thus occupies more area in the surface of the wiring board, thereby placing a limit on an increase in wiring density under development of wiring board.

SUMMARY

At least one embodiment of the disclosure provides a wiring board which includes a plurality of conductive columns facilitating an increase in wiring density.

At least one embodiment of the disclosure provides a method of manufacturing the abovementioned wiring board.

A wiring board according to at least one embodiment of the disclosure includes a first insulating layer, a first wiring layer and a plurality of first conductive columns. The first insulating layer has a first surface and a second surface opposite to the first surface. The first wiring layer is disposed in the first insulating layer and has a third surface and a fourth surface opposite to the third surface, in which the first insulating layer covers the third surface, and the second surface of the first insulating layer is flush with the fourth surface of the first wiring layer. The first conductive columns are disposed in the first insulating layer and connected to the first wiring layer, in which the first conductive columns extend from the third surface of the first wiring layer to the first surface of the first insulating layer, and the first conductive columns protrude from the first surface.

A method of manufacturing a wiring board according to at least one embodiment of the disclosure includes forming a first shade layer on an initial insulating layer, in which the first shade layer has a first hollow pattern. A second shade layer is formed on the first shade layer, where the second shade layer has a second hollow pattern different from the first hollow pattern, and the part of the first hollow pattern and the part of the second hollow pattern overlap. Afterward, by using the first shade layer and the second shade layer as masks, the initial insulating layer is etched, so as to form a first insulating layer having a plurality of recesses and a plurality of trenches, in which the recesses are connected to the trenches, and the recesses extend from the bottoms of the trenches in a direction away from the trenches. Afterward, a conductive material is deposited in the recesses and the trenches, so as to form a plurality of first conductive columns in the recesses, and to form a first wiring layer in the trenches. Afterward, the part of the first insulating layer adjacent to the first conductive columns is removed, so that the first conductive columns protrude from the surface of the first insulating layer.

Based on the above, since the first conductive columns protrude from the first surface of the first insulating layer, the part of each of the first conductive columns protruding from the first surface can be used as a pad for electrically connecting external electronic components. In addition, it is advantageous to increase the wiring density for meeting the current development trend toward high wiring density in wiring boards.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
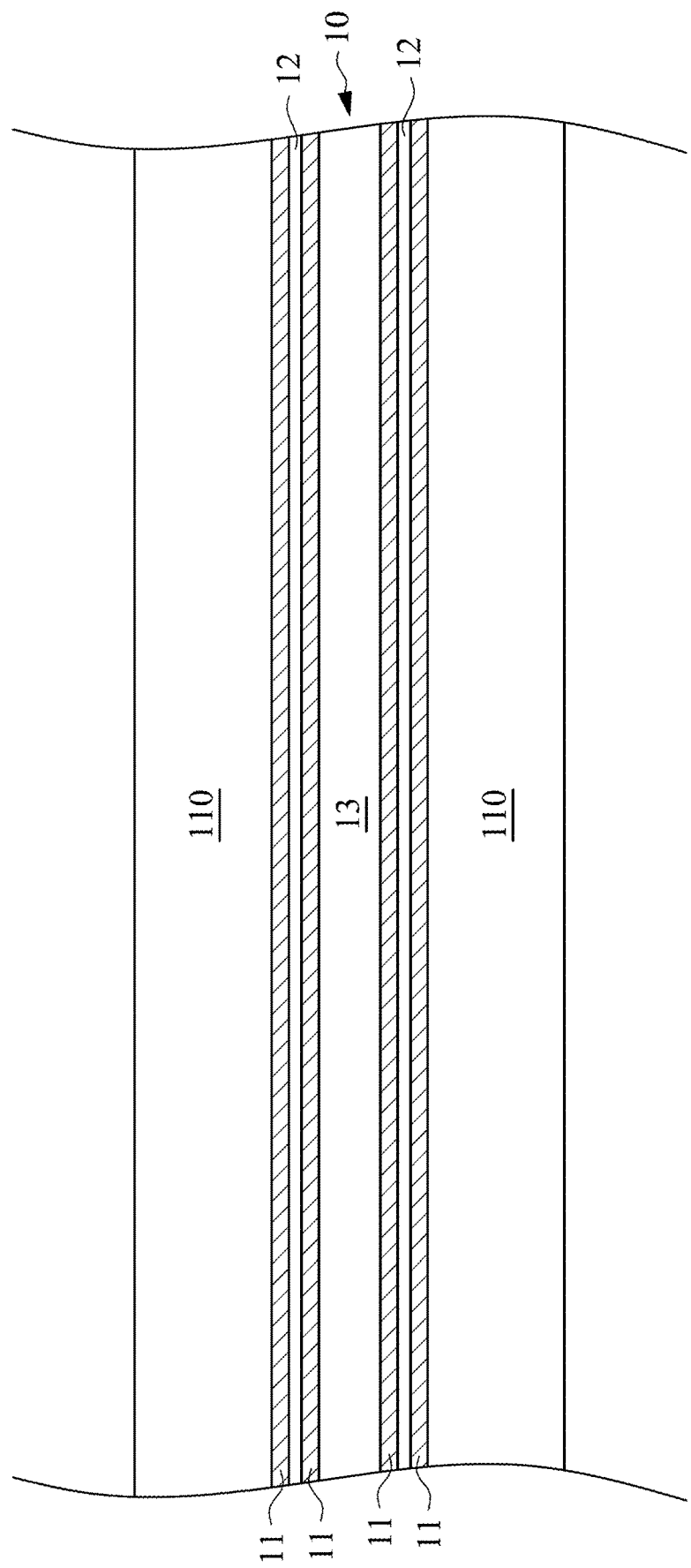
FIGS. 1 to 8 are schematic cross-sectional views of a method of manufacturing a wiring board according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

FIGS. 1 to 8 are schematic cross-sectional views of a method of manufacturing a wiring board according to at least one embodiment of this disclosure. Referring to FIG. 1, in the method of manufacturing according to the embodiment, first, a holding board 10 can be provided and include at least two metal layers 11, a supporting substrate 13 and at least one release layer 12. The metal layers 11 are all disposed on the supporting substrate 13, and the release layer 12 is disposed between two adjacent metal layers 11. The metal layers 11 can be metal foil, such as copper foil, and the material of the supporting substrate 13 can include a polymer material, such as resin.

In the embodiment as shown in FIG. 1, the holding board 10 can include four metal layers 11, at least two release layers 12 and one supporting substrate 13. The metal layers 11 are all disposed on the supporting substrate 13, where two metal layers 11 are located on one side of the supporting substrate 13, and the other two metal layers 11 are located on the other side of the supporting substrate 13. Accordingly, the supporting substrate 13 is located between the metal layers 11. At least one metal layer 11 is connected to the supporting substrate 13.

Taking FIG. 1 for example, two of the metal layers 11 are connected to two opposite sides of the supporting substrate 13 respectively and can adhere to the supporting substrate 13. Each of the release layers 12 is disposed between two adjacent metal layers 11, so that each of the release layers 12 can be sandwiched between two metal layers 11. In addition, the supporting substrate 13 is also located between two release layers 12, as shown in FIG. 1.

In other embodiment, the holding board 10 can include two metal layers 11, one supporting substrate 13 and one release layer 12, in which the release layer 12 and the two metal layers 11 are all disposed on the same side of the supporting substrate 13. In other words, in the embodiment as shown in FIG. 1, two metal layers 11 and one release layer 12 located on the same side of the supporting substrate 13 can be omitted, so that FIG. 1 does not limit the quantities of both the metal layers 11 and the release layer 12 included in the holding board 10.

Afterward, at least one initial insulating layer 110 is formed on the metal layers 11, where one of the metal layers 11 is connected to the initial insulating layer 110. Taking FIG. 1 for example, two initial insulating layers 110 can be formed on two opposite sides of the holding board 10, so that the holding board 10 is located between the initial insulating layers 110, in which each of the initial insulating layers 110 is formed on one side of two adjacent metal layers 11, as shown in FIG. 1. Hence, two adjacent metal layers 11 can be located between the supporting substrate 13 and one of the initial insulating layers 110.

In the metal layers 11 on the same side of the supporting substrate 13, one metal layer 11 is connected to the supporting substrate 13, and the other metal layer 11 is connected to the initial insulating layer 110. For example, two adjacent metal layers 11 can adhere to the supporting substrate 13 and the initial insulating layer 110 respectively, as shown in FIG. 1. In addition, the material of the initial insulating layer 110 can be a polymer material, such as ABF (Ajinomoto Film) resin.

It is worth mentioning that in other embodiment, the metal layers 11 and the release layer 12 located on one side of the supporting substrate 13 can be omitted, so that the release layer 12 and the metal layers 11 are only disposed on the other side of the supporting substrate 13. When both the release layer 12 and the metal layers 11 are only disposed on one side of the supporting substrate 13 and not disposed on the other side of the supporting substrate 13, only one initial insulating layer 110 can be formed, in which the initial insulating layer 110 and the metal layers 11 are all located on the same side of the supporting substrate 13. In other words, the metal layers 11, the release layer 12 and the initial insulating layer 110 located on one side of the supporting substrate 13 can be omitted from FIG. 1, whereas the metal layers 11, the release layer 12 and the initial insulating layer 110 located on the other side of supporting substrate 13 can remain.

Figure 2:
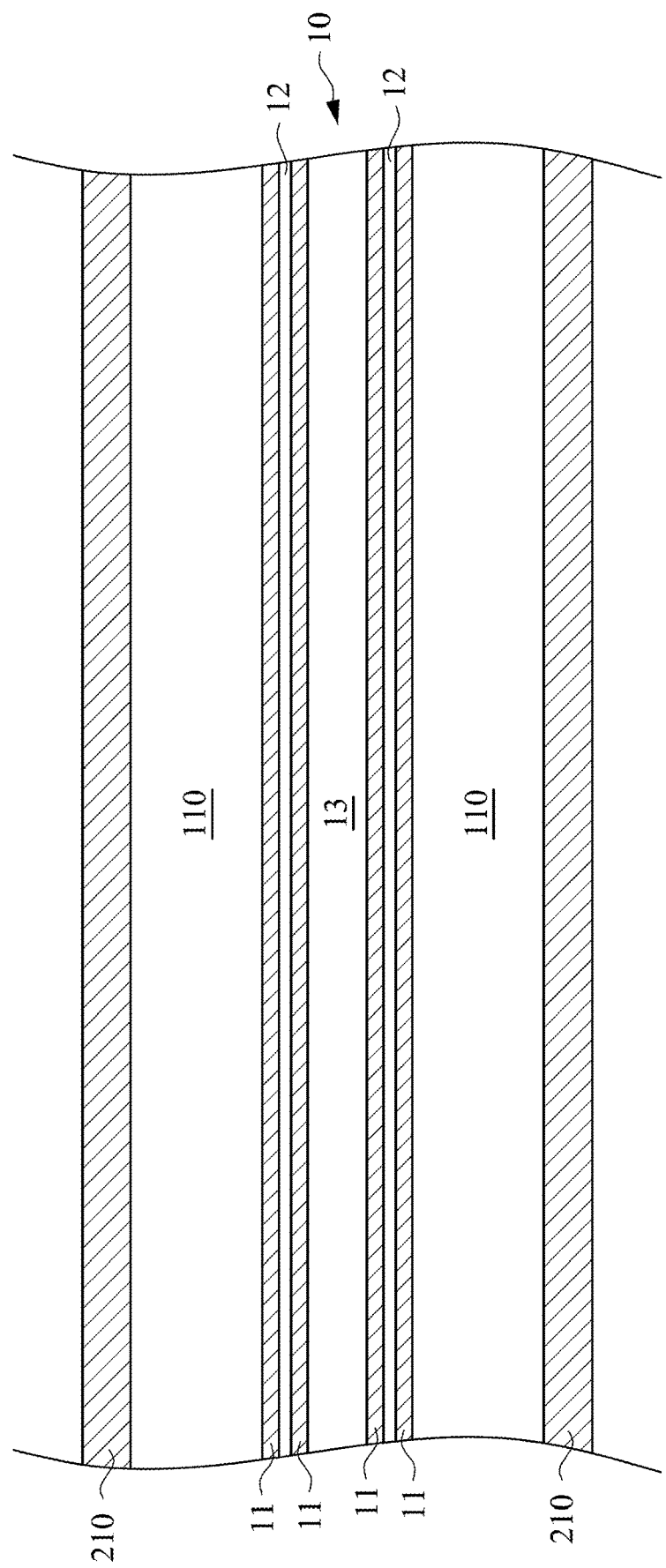

Referring to FIG. 2, afterward, multiple metal layers 210 are formed on the initial insulating layers 110. In the embodiment, the metal layers 210 can be metal foil, such as copper foil, so that forming the metal layers 210 can be adhering metal foil to the initial insulating layers 110. Since two initial insulating layers 110 can be formed on two opposite sides of the holding board 10 respectively in the embodiment shown in FIG. 1, two metal layers 210 can be formed on the initial insulating layers 110 respectively in the embodiment shown in FIG. 2. However, it is necessary to note that in other embodiment, since only one initial insulating layer 110 can be formed, only one metal layer 210 can be formed on the only one initial insulating layer 110. In other words, just one metal layer 210 can be formed.

Figure 3:
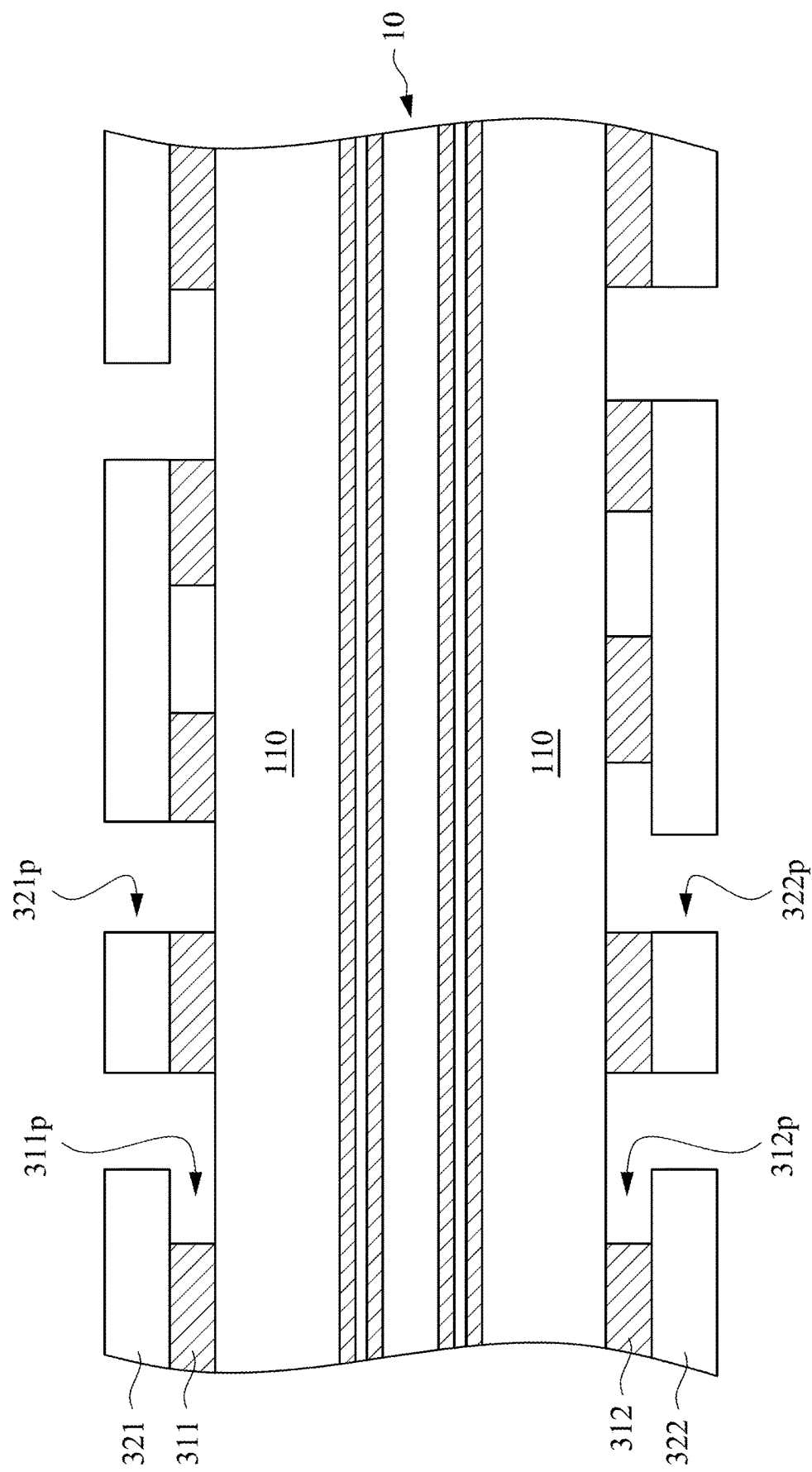

Referring to FIG. 3, afterward, the metal layers 210 are patterned, so as to form two first shade layers 311 and 312 on the initial insulating layers 110 respectively, in which patterning the metal layers 210 can be photolithography and etching. Since the first shade layers 311 and 312 are formed by patterning the metal layers 210, the first shade layers 311 and 312 are all metal pattern layers.

It is worth mentioning that in other embodiment, the metal layers 210 can be a metal film formed by deposition, in which the deposition may be electroplating or electroless plating, for example. Hence, the first shade layers 311 and 312 are not limited to being made of metal foil. In addition, in other embodiment, the first shade layers 311 and 312 can be formed by semi-additive process or additive process. Specifically, two pattern layers (not shown), such as photoresist patterns after exposure and development, can be formed on the initial insulating layers 110 respectively. Afterward, by using the pattern layers as masks, electroplating or electroless plating is performed. As a result, the first shade layers 311 and 312 are formed. After the first shade layers 311 and 312 are formed, the pattern layers are removed.

The first shade layers 311 and 312 have first hollow patterns 311p and 312p respectively. The first hollow patterns 311p and 312p are all the patterned openings of the first shade layers 311 and 312 and partially expose the initial insulating layers 110, where the shapes of the first hollow patterns 311p and 312p may be the same or different. Taking FIG. 3 for example, the shapes of the first hollow patterns 311p and 312p may be different from each other.

Afterward, two second shade layers 321 and 322 are formed on the first shade layers 311 and 312 respectively, in which the second shade layers 321 and 322 have two second hollow patterns 321p and 322p respectively. The second hollow patterns 321p and 322p are all the patterned openings of the second shade layers 321 and 322, in which each of the second hollow patterns 321p and 322p can be different from any one of the first hollow patterns 311p and 312p. Taking FIG. 3 for example, the second hollow patterns 321p and the first hollow pattern 311p do not overlap completely, while the second hollow pattern 322p and the first hollow pattern 312p do not overlap completely. Hence, the second hollow pattern 321p and the first hollow pattern 311p are different from each other, whereas the second hollow pattern 322p and the first hollow pattern 312p are different from each other.

In this embodiment, the part of the first hollow pattern 311p and the part of the second hollow pattern 321p overlap, whereas the part of the first hollow pattern 312p and the part of the second hollow pattern 322p overlap. The first hollow patterns 311p, 312p and the second hollow patterns 321p, 322p are all patterned openings, so that at least one part of the first hollow pattern 311p and at least one part of the second hollow pattern 321p are connected to each other while the first hollow pattern 311p and the second hollow pattern 321p overlap partially, and at least one part of the first hollow pattern 312p and at least one part of the second hollow pattern 322p are connected to each other while the first hollow pattern 312p and the second hollow pattern 322p overlap partially. Accordingly, the second hollow patterns 321p and 322p can partially expose the initial insulating layers 110 respectively, as shown in FIG. 3.

Figure 4:
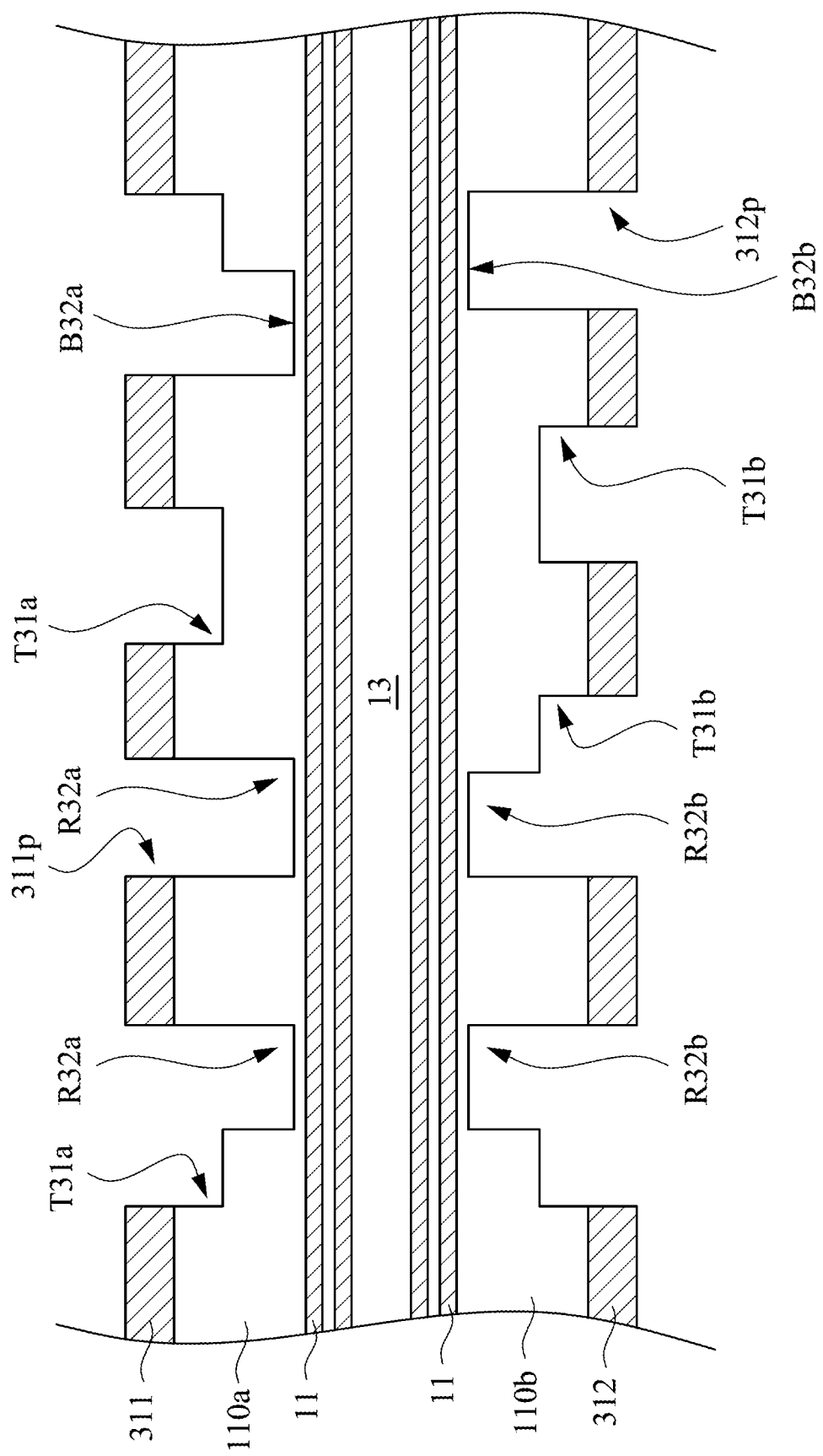

Referring to FIGS. 3 and 4, afterward, by using the first shade layers 311, 312 and the second shade layers 321, 322 as masks, the initial insulating layers 110 are etched, so as to form a plurality of first insulating layers 110a and 110b. The first insulating layer 110a has a plurality of recesses R32a and a plurality of trenches T31a, while the first insulating layer 110b has a plurality of recesses R32b and a plurality of trenches T31b. In the first insulating layer 110a, the recesses R32a are connected to the trenches T31a, and the recesses R32a all extend from the bottoms of the trenches T31a in a direction away from the trenches T31a. In the first insulating layer 110b, the recesses R32b are connected to the trenches T31b, and the recesses R32b all extend from the bottoms of the trenches T31b in a direction away from the trenches T31b.

The second shade layers 321 and 322 all can be photoresist pattern layers. That is, each of the second shade layers 321 and 322 can be formed by performing exposure and development on photoresist layers. Etching the initial insulating layers 110 can be dry etching, that is to say, etching the initial insulating layers 110 with plasma. The gas used by the previous dry etching can include oxygen and carbon tetrafluoride, so the plasma used in the dry etching is formed by ionizating oxygen and carbon tetrafluoride. Hence, the part of the initial insulating layer 110 which is etched can be removed by plasma ashing.

Since the second shade layers 321 and 322 all can be the photoresist pattern layers, in the process of etching the initial insulating layers 110, the second shade layers 321 and 322 also can be removed by plasma ashing. In addition, all of the first shade layers 311 and 312 may be metal pattern layers, so the plasma etches the first shade layers 311 and 312 difficultly. Accordingly, the first shade layers 311 and 312 can be used as masks for etching. Hence, etching the initial insulating layers 110 can be ashing the second shade layers 321, 322 and the part of each of the initial insulating layers 110 by using the first shade layers 311 and 312 as masks.

In the process of etching the initial insulating layers 110, the plasma first etches the outermost second shade layers 321, 322 and the parts of the initial insulating layers 110 which are not covered by the first shade layers 311, 312 and the second shade layers 321, 322, thereby forming the recesses R32a, R32b and the trenches T31a, T31b, where the second shade layers 321 and 322 are used for the formation of the recesses R32a and R32b, and the first shade layers 311 and 312 are used for the formation of the trenches T31a and T31b.

It is necessary to note that in the embodiment, the first shade layers 311 and 312 are metal pattern layers, and the second shade layers 321 and 322 are photoresist pattern layers. However, in other embodiment, the first shade layers 311 and 312 and the second shade layers 321 and 322 can be photoresist pattern layers, where the composition of photoresists in the first shade layers 311 and 312 can be different from the composition of photoresists in the second shade layers 321 and 322, so that the etching rates of the first shade layers 311 and 312 can be different from the etching rates of the second shade layers 321 and 322 during etching the initial insulating layers 110, thereby forming the recesses R32a, R32b and the trenches T31a, T31b. Hence, the first shade layers 311 and 312 are not limited to the metal pattern layers.

It is worth mentioning that each of the recesses R32a and R32b does not extend to any one of the metal layers 11 of the holding board 10. In other words, in the process of etching the initial insulating layers 110, etching media, such as the plasma, does not penetrate any one of the initial insulating layers 110, so the bottom B32a of each of the recesses R32a remains in the first insulating layer 110a, and the bottom B32b of each of the recesses R32b remains in the first insulating layer 110b. As a result, the recesses R32a, R32b and the trenches T31a, T31b cannot expose any one of the metal layers 11, as shown in FIG. 4.

Figure 5:
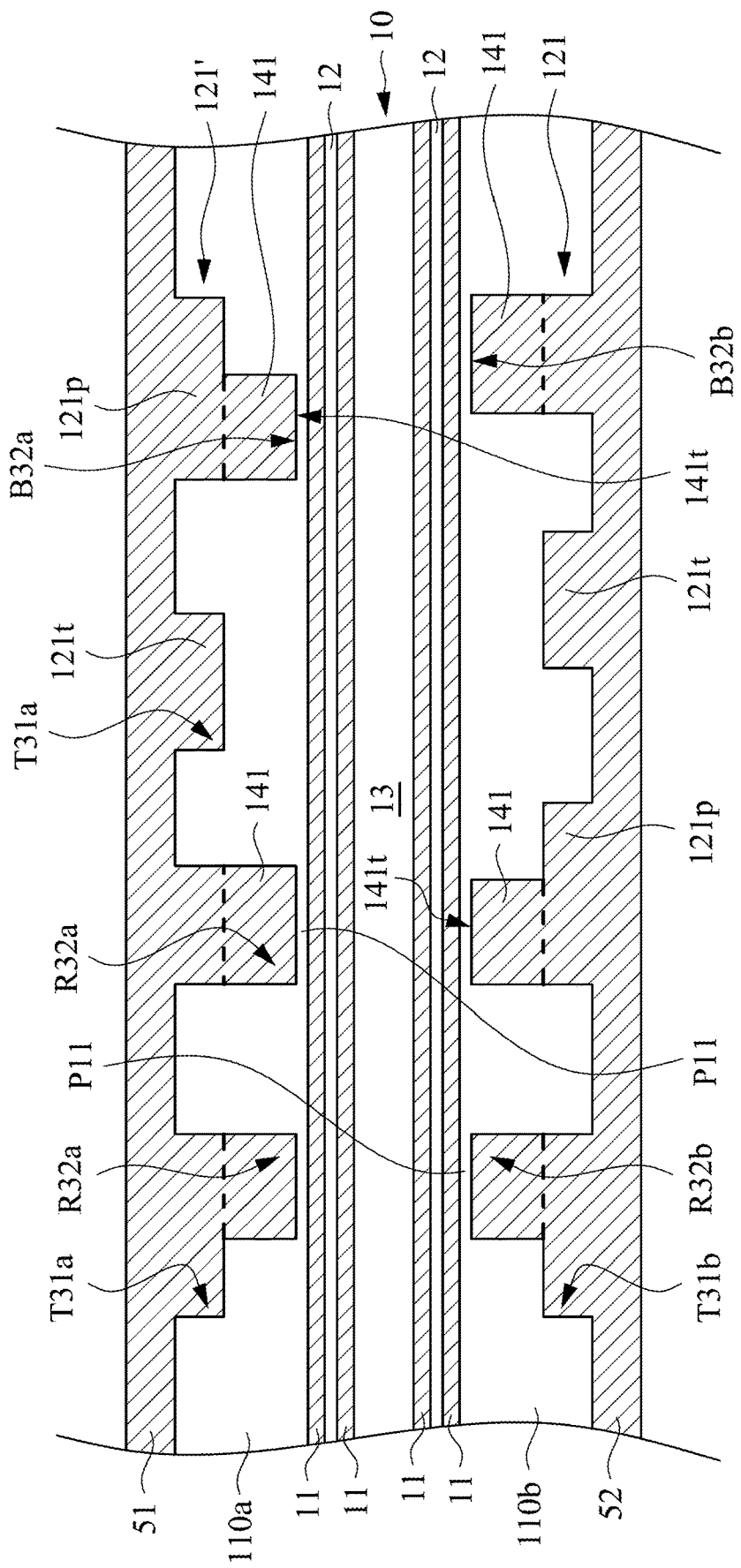

Referring to FIG. 5, afterward, a conductive material is deposited in the recesses R32a, R32b and the trenches T31a, T31b, so as to form a plurality of first conductive columns 141 in the recesses R32a and R32b, and to form the first wiring layers 121 and 121' in the trenches T31a and T31b. The first wiring layers 121 and 121' include a plurality of pads 121p and a plurality of traces 121t, where the first conductive columns 141 can be connected to the pads 121p respectively. Depositing the conductive material can include electroplating and electroless plating, where the conductive material may be metal, such as copper.

Since the recesses R32a are connected to the trenches T31a, the first conductive columns 141 in the first insulating layer 110a can be connected to the first wiring layer 121', where the first conductive columns 141 and the first wiring layer 121' are integrally formed into one after depositing the conductive material. That is to say, in the first insulating layer 110a, there is no seam or joint between each first conductive column 141 and the first wiring layer 121'. Even if the first conductive columns 141 and the first wiring layer 121' are sectioned, no seam or joint exists in the cross sectional structure between each first conductive column 141 and the first wiring layer 121'. Likewise, since the recesses R32b are connected to the trenches T31b, the first conductive columns 141 in the first insulating layer 110b can be connected to the first wiring layer 121, where the first conductive columns 141 and the first wiring layer 121 are integrally formed into one.

It is necessary to note that in FIG. 5, each first conductive column 141 and the first wiring layer 121 or 121' are separated by a dashed line, so that FIG. 5 can clearly show the first conductive columns 141, the first wiring layers 121 and 121'. However, under the condition that the first wiring layers 121 and 121' and the corresponding first conductive columns 141 are integrally formed into one, the dashed lines shown in FIG. 5 are not real and visible boundaries, such as seams or joints. Hence, the dashed lines shown in FIG. 5 are virtual and just used for showing the first conductive columns 141 and the first wiring layers 121 and 121' clearly.

In the process of depositing the conductive material in the recesses R32a, R32b and the trenches T31a, T31b, two conductive layers 51 and 52 are additionally formed on the first insulating layers 110a and 110b respectively. In the embodiment shown in FIG. 5, the conductive layer 51 is connected to the first wiring layer 121', in which the first wiring layer 121' is located between the conductive layer 51 and the first conductive columns 141 in the first insulating layer 110a. The conductive layer 52 is connected to the first wiring layer 121, in which the first wiring layer 121 is located between the conductive layer 52 and the first conductive columns 141 in the first insulating layer 110b. Each of the conductive layers 51 and 52 has a part which can be formed by electroplating with the first shade layers 311 and 312, and the conductive layers 51 and 52 can be metal layers.

Each of the first conductive columns 141 has an end face 141t, in which the end faces 141t of the first conductive columns 141 are located on the bottoms B32a and B32b of the recesses R32a and R32b respectively. Since each of the recesses R32a and R32b does not extend to any one of the metal layers 11 of the holding board 10, the part of the first insulating layer 110a and the part of the first insulating layer 110b can cover the end faces 141t of the first conductive columns 141. Taking FIG. 5 for example, the first insulating layers 110a and 110b have a covering part P11 apiece. Each of the covering parts P11 is located between the holding board 10 and the first conductive columns 141 and spaces each first conductive column 141 from the metal layer 11, so that the first conductive columns 141 cannot touch the metal layer 11 directly.

Figure 6:
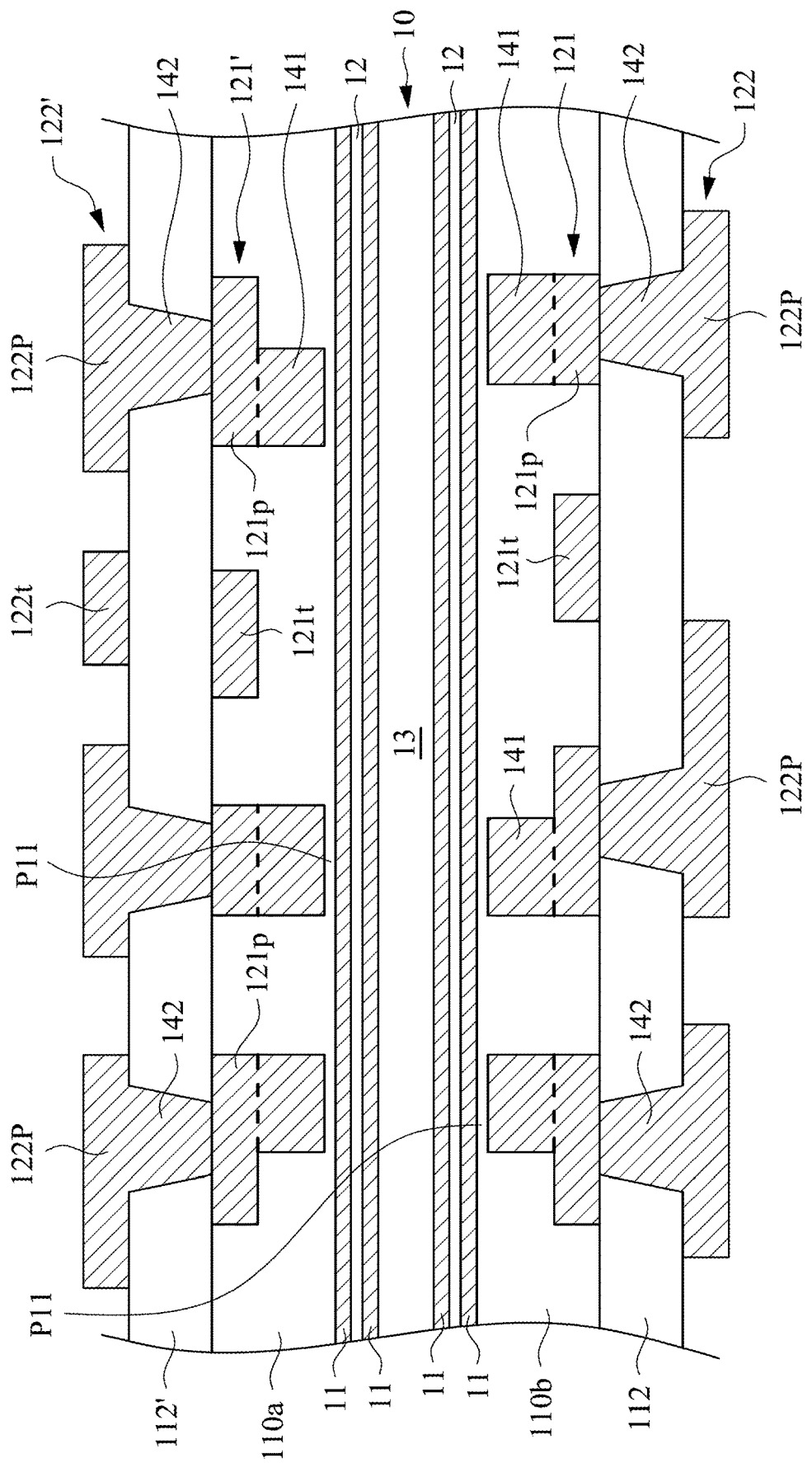

Referring to FIG. 6, after the first conductive columns 141 and the first wiring layers 121, 121' are formed, two second insulating layers 112 and 112', two second wiring layers 122 and 122' and a plurality of the second conductive columns 142 are formed on the first wiring layers 121 and 121', where the second wiring layers 122 and 122' include a plurality of pads 122p and a plurality of traces 122t. The second insulating layers 112 and 112', the second wiring layers 122 and 122', and the second conductive columns 142 can be formed by semi-additive process. Before the second insulating layers 112 and 112', the second wiring layers 122 and 122', and the second conductive columns 142 are formed, the conductive layers 51 and 52 (referring to FIG. 5) can be removed. For example, the conductive layers 51 and 52 can be removed by etching or polishing.

The second insulating layer 112' is disposed between the second wiring layer 122' and the first wiring layer 121', while the second insulating layer 112 is disposed between the second wiring layer 122 and the first wiring layer 121. The second conductive columns 142 are disposed in the second insulating layers 112 and 112'. The second conductive columns 142 in the second insulating layer 112' are connected to the first wiring layer 121' and the second wiring layer 122', whereas the second conductive columns 142 in the second insulating layer 112 are connected to the first wiring layer 121 and the second wiring layer 122.

Figure 7:
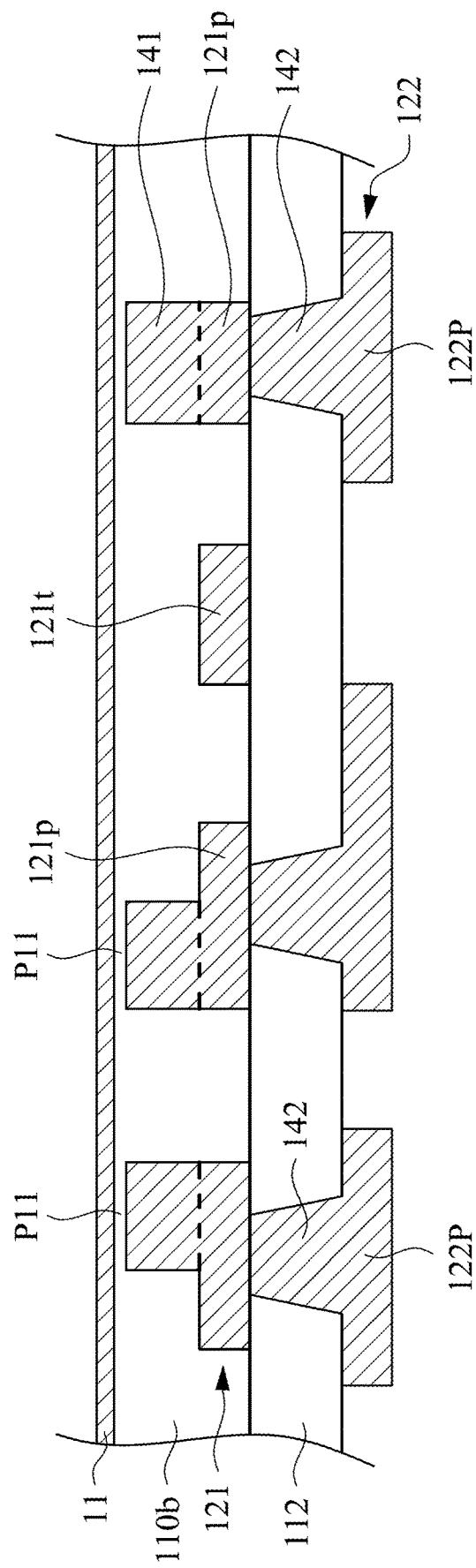

Referring to FIGS. 6 and 7, after the first conductive columns 141, the second conductive columns 142, the first wiring layer 121', 121 and the second wiring layers 122', 122 are formed, the supporting substrate 13 and the metal layers 11 connected to the supporting substrate 13 are peeled off by using the release layers 12, so that the two metal layers 11 connected to the first insulating layers 110a and 110b can be separated from the supporting substrate 13.

After peeling off the supporting substrate 13 and the metal layers 11 connected to the supporting substrate 13, the first insulating layer 110a, the first conductive columns 141 in the first insulating layer 110a, the first wiring layer 121', the second insulating layer 112', the second conductive columns 142 in the second insulating layer 112' and the second wiring layer 122' can be used to make a wiring board. The first insulating layer 110b, the first conductive columns 141 in the first insulating layer 110b, the first wiring layer 121, the second insulating layer 112, the second conductive columns 142 in the second insulating layer 112 and the second wiring layer 122 can be used to make another wiring board. Hence, one holding board 10 can make two wiring boards.

FIG. 7 is illustrated with one film structure below the supporting substrate 13 shown in FIG. 6, for example, so as to describe the following processes. Accordingly, FIG. 7 depicts the first insulating layer 110b, the first conductive columns 141 in the first insulating layer 110b, the first wiring layer 121, the second insulating layer 112, the second conductive columns 142 in the second insulating layer 112 and the second wiring layer 122 all in FIG. 6, but omits the first insulating layer 110a, the first conductive columns 141 in the first insulating layer 110a, the first wiring layer 121', the second insulating layer 112', the second conductive columns 142 in the second insulating layer 112' and the second wiring layer 122' from FIG. 6.

Figure 8:
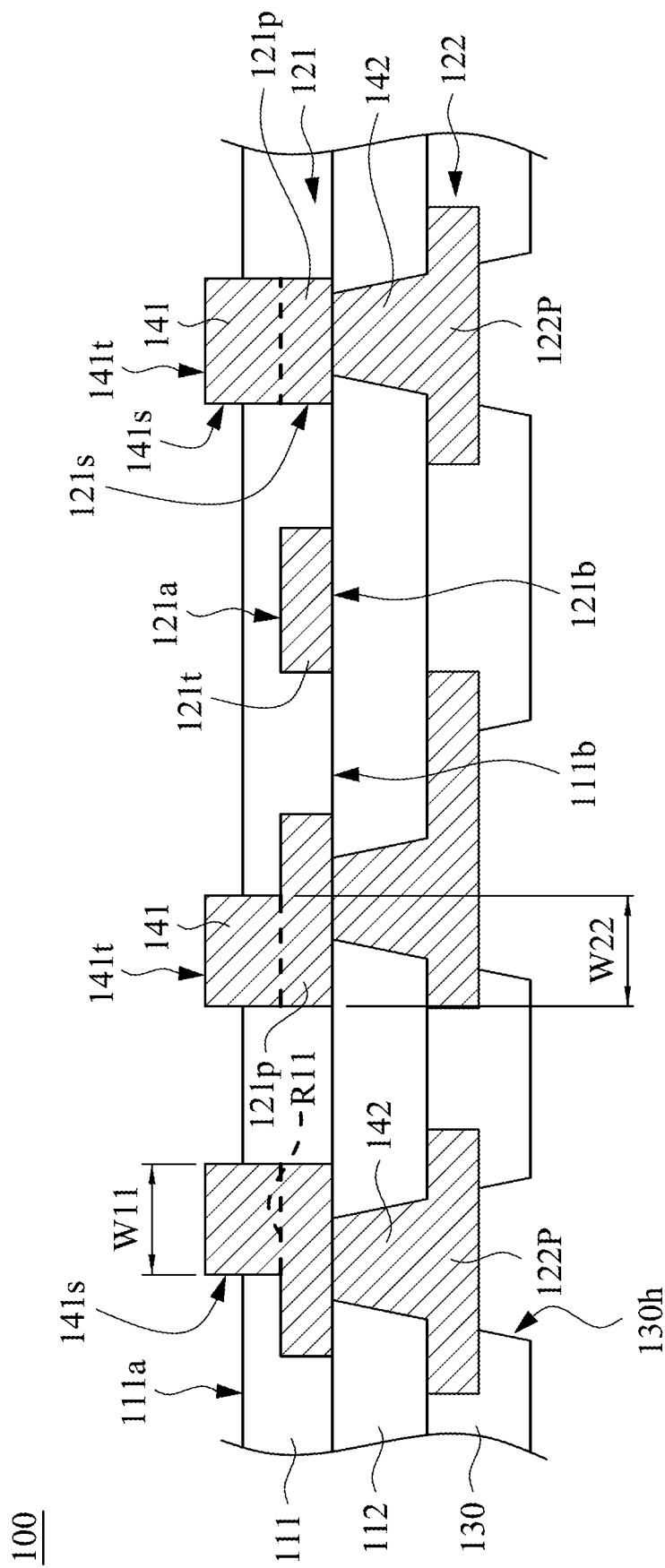

It is necessary to note that the steps disclosed in FIGS. 7 and 8 can be performed on the first insulating layer 110a, the first conductive columns 141 in the first insulating layer 110a, the first wiring layer 121', the second insulating layer 112', the second conductive columns 142 in the second insulating layer 112' and the second wiring layer 122' all in FIG. 6, thereby making another wiring board. That is, the following process can be performed on the other film structure above the supporting substrate 13 shown in FIG. 6 to make another wiring board.

Referring to FIGS. 7 and 8, after peeling off the supporting substrate 13 and the metal layers 11 connected to the supporting substrate 13, the metal layer 11 connected to the first insulating layer 110b is removed to expose the first insulating layer 110b, where the removal of the metal layer 11 can be etching or polishing. Since a part (i.e., covering part P11) of the first insulating layer 110b covers the end faces 141t of the first conductive columns 141, the covering part P11 can be used as an etching stop layer to prevent the etching media (e.g., etchant) from damaging the first conductive columns 141 in the process of removing the metal layer 11 by etching.

After the metal layer 11 is removed, the part of the first insulating layer 110b adjacent to the first conductive columns 141 is removed, i.e., the covering part P11 is removed, so as to form a first insulating layer 111. So far, a wiring board 100 including the first insulating layer 111, the first wiring layer 121, the second insulating layer 112, the second wiring layer 122, the first conductive columns 141 and the second conductive columns 142 are basically complete.

The first conductive columns 141 protrude from the surface of the first insulating layer 111. Taking FIG. 8 for example, the first insulating layer 111 has a first surface 111a and a second surface 111b opposite to the first surface 111a. The first surface 111a may be the upper surface of the first insulating layer 111, and the second surface 111b may be the lower surface of the first insulating layer 111, where the first conductive columns 141 protrude from the first surface 111a. As a result, the end with the end face 141t of the first conductive column 141 can be used as a pad for electrically connecting an external electronic component, such as a discrete component, an unpackaged die or a packaged chip.

The removal of the part of the first insulating layer 110b adjacent to the first conductive columns 141 can be etching, in which the etching media which does not damage metal can be selected to etch the first insulating layer 110b, thereby avoiding damaging the first conductive columns 141 in the process of etching the first insulating layer 110b. Moreover, after the part of the first insulating layer 110b adjacent to the first conductive columns 141 is removed, an insulating protective layer 130, such as a solder mask, can be formed on the second insulating layer 112. The insulating protective layer 130 covers the second insulating layer 112 and has a plurality of openings 130h exposing the pads 122p, so that the pads 122p can be electrically connected to the external electronic components, such as discrete components, unpackaged dies or packaged chips.

It is worth mentioning that in other embodiment, only one side of the holding board 10 can be used to manufacture the wiring board 100, and the other side of the holding board 10 may not be used to manufacture the wiring board 100 when the holding board 10 only includes two metal layers 11, one supporting substrate 13 and one release layer 12, and only one initial insulating layer 110 is formed. Hence, in the previous steps as disclosed in FIGS. 1 to 6, the films above the supporting substrate 13, for example, the metal layers 11, the first insulating layer 110a, the first wiring layer 121', the second insulating layer 112' and the second wiring layer 122', can be omitted, and the processes disclosed in FIGS. 1 to 6 do not limit the method of manufacturing the wiring board 100.

In the embodiment as shown in FIG. 8, the quantity of the wiring layers included in the wiring board 100 is two, i.e., the first wiring layer 121 and the second wiring layer 122. However, in other embodiment, the wiring layer included in the wiring board 100 can be the first wiring layer 121 only. Alternatively, the wiring board 100 can include three or more than three wiring layers. For example, in other embodiment, the wiring board 100 can include the first wiring layer 121, the second wiring layer 122 and a third wiring layer (not shown), in which the second wiring layer 122 is located between the first wiring layer 121 and the third wiring layer, and the third wiring layer can be formed on the second wiring layer 122 by using semi-additive process.

In addition, the method of making the second wiring layers 122, 122', the second conductive columns 142 and the abovementioned third wiring layer can be the same as the method of making the first wiring layers 121, 121' and the first conductive columns 141. Alternatively, the method of making the third wiring layer can be the same as the method of making the first wiring layers 121 and 121', but the second wiring layers 122, 122' and the second conductive columns 142 can be made by using semi-additive process. Hence, the method of making the third wiring layer can be the same as or different from the method of making the second wiring layers 122, 122' and the second conductive columns 142.

As a result, the quantity of the wiring layer included in the wiring board 100 can be only one, two or more than two, while FIG. 8 does not limit the quantity of the wiring layer of the wiring board 100. In addition, when the wiring layer included in the wiring board 100 is the first wiring layer 121 only, the wiring board 100 may not include the second insulating layer 112, the second wiring layer 122, the second conductive columns 142 and the insulating protective layer 130. In other words, the second insulating layer 112, the second wiring layer 122, the second conductive columns 142 and the insulating protective layer 130 can be omitted from FIG. 8.

Referring to FIG. 8, the first wiring layer 121 is disposed in the first insulating layer 111 and has a third surface 121a and a fourth surface 121b opposite to the third surface 121a, in which the first insulating layer 111 covers the third surface 121a. In the above method of manufacturing the wiring board 100, when the conductive layers 51 and 52 (referring to FIG. 5) are removed by polishing, the second surface 111b of the first insulating layer 111 is flush with the fourth surface 121b of the first wiring layer 121. In other words, the second surface 111b and the fourth surface 121b can be coplanar, as shown in FIG. 8.

The second insulating layer 112 is disposed between the first wiring layer 121 and the second wiring layer 122. The first conductive columns 141 are disposed in the first insulating layer 111, in which the first conductive columns 141 extend from the third surface 121a of the first wiring layer 121 to the first surface 111a of the first insulating layer 111 and protrude from the first surface 111a, so that the end (having the end face 141t) of the first conductive column 141 can be used as a pad, thereby causing the wiring board 100 to be electrically connected to the external electronic components via the first conductive columns 141.

Each of the first conductive columns 141 has not only the end face 141t opposite to the third surface 121a, but also the sidewall 141s, in which the sidewall 141s is connected to the edge of the end face 141t and extends from the edge of the end face 141t to the first wiring layer 121. In addition, the sidewall 141s of at least one of the first conductive columns 141 can be perpendicular to the third surface 121a of the first wiring layer 121, as shown in the leftmost first conductive column 141 in FIG. 8. At least one part of the sidewall 141s of at least one first conductive column 141 can be flush with at least one part of the side 121s of the first wiring layer 121, as shown in FIG. 8.

Each of the first conductive columns 141 and the first wiring layer 121 overlap to form an overlapping area R11. In the same first conductive column 141, the width W11 of the end face 141t can be substantially equal to the width of the overlapping area R11, in which the width of the overlapping area R11 is equivalent to the width of the bottom of the first conductive column 141. Specifically, within allowable tolerance, the width W11 may not be equal to the width of the overlapping area R11, and a ratio of the width W11 to the width W22 of the overlapping area R11 can range between 0.7 and 1, such as 0.7, 0.8 or 1. Hence, each of the first conductive columns 141 substantially has a uniform width, which is equivalent to the width W11.

Since each of the first conductive columns 141 substantially has the uniform width, the part of the first conductive column 141 protruding from the first surface 111a can be used as a pad without annular ring, so as to reduce the area of the surface (e.g., first surface 111a) of the wiring board 100 which the first conductive column 141 occupies. Accordingly, it is advantageous to increase the wiring density of the wiring board 100 for meeting the current development trend toward high wiring density in wiring boards.

It is particularly mentioned that in the embodiment, each of the second conductive columns 142 can be a conductive blind via and be formed by laser drilling, electroless plating and electroplating. Hence, unlike the first conductive columns 141, each of the second conductive columns 142 has a nonuniform width, where the width of each of the second conductive columns 142 can increase gradually from the first wiring layer 121 to the second wiring layer 122, as shown in FIG. 8.

FIGS. 9 to 15 are schematic cross-sectional views of a method of manufacturing a wiring board according to another embodiment of this disclosure, where the method of manufacturing in this embodiment is similar to the method of manufacturing in the previous embodiment, and the method of manufacturing in this embodiment also can make the abovementioned wiring board 100. The following mainly describes and depicts the differences between this embodiment and the previous embodiment, and the same features of the two are basically not repeated.

Figure 9:
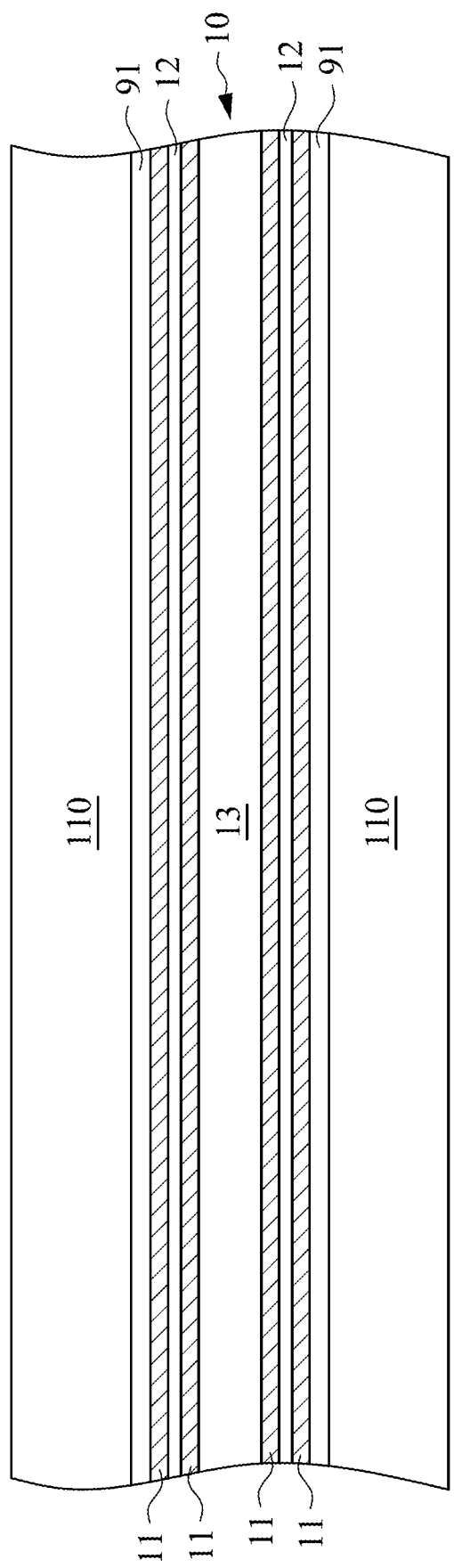
FIGS. 9 to 15 are schematic cross-sectional views of a method of manufacturing a wiring board according to another embodiment of this disclosure.

Referring to FIG. 9, first, the holding board 10 can be provided. Afterward, at least one etching stop layer 91 and the initial insulating layers 110 can be formed on the metal layers 11 of the holding board 10, in which the initial insulating layer 110 can cover the etching stop layer 91. Taking FIG. 9 for example, two etching stop layers 91 and two initial insulating layers 110 can be formed on two opposite sides of the holding board 10 respectively, so that the holding board 10 is located between the initial insulating layers 110 and between the etching stop layers 91.

Each of the etching stop layers 91 is formed on one side of two adjacent metal layers 11. Thus, two adjacent metal layers 11 can be located between the supporting substrate 13 and one of the etching stop layers 91. One of the metal layers 11 is connected to the supporting substrate 13, and another of the metal layers 11 is connected to the etching stop layer 91. In addition, the etching stop layers 91 can be metal layers or insulating layers, such as nickel layers, polymer material layers or inorganic insulating layers.

Figure 10:
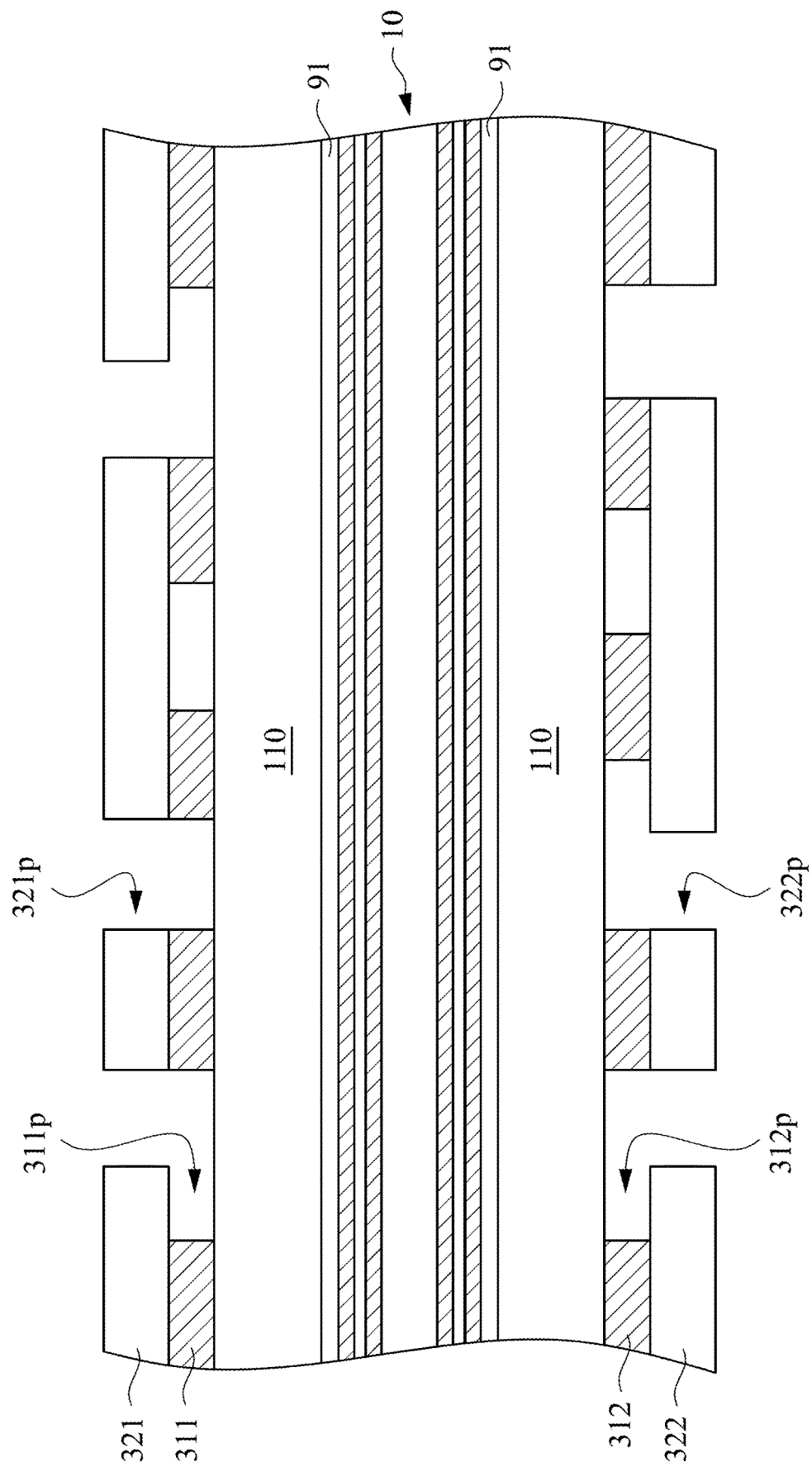

Referring to FIG. 10, next, two first shade layers 311 and 312 and two second shade layers 321 and 322 are formed on the initial insulating layers 110 respectively, where the formations of the first shade layers 311 and 312 and the second shade layers 321 and 322 have been disclosed in the foregoing embodiment, and will not be repeated here.

Figure 11:
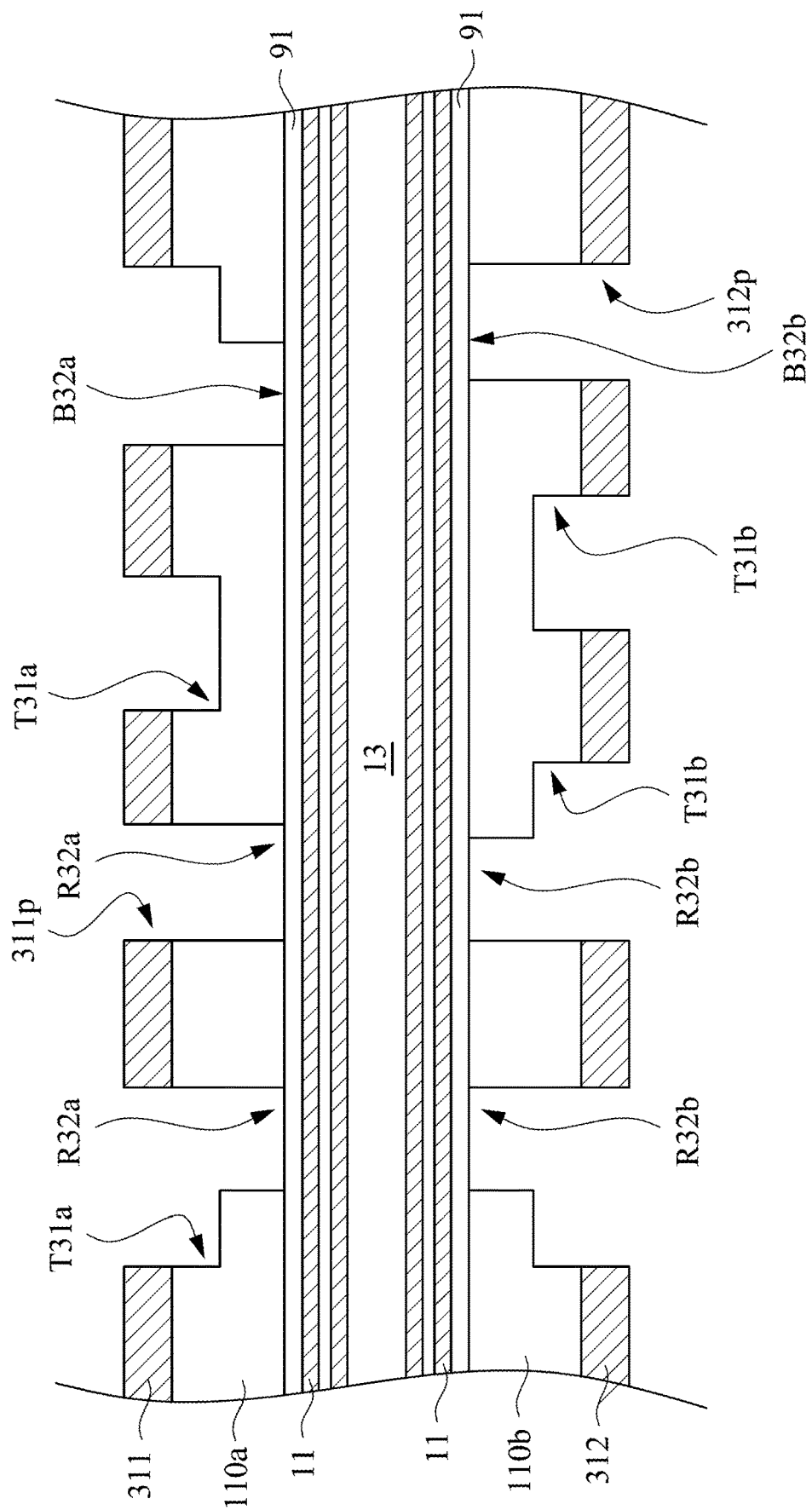

Referring to FIGS. 10 and 11, afterward, the initial insulating layers 110 are etched to form the first insulating layers 110a and 110b by using the first shade layers 311, 312 and the second shade layers 321, 322 as masks, in which the first insulating layer 110a has a plurality of recesses R32a and a plurality of trenches T31a, whereas the first insulating layer 110b has a plurality of recesses R32b and a plurality of trenches T31b.

Unlike the abovementioned embodiment, in the first insulating layer 110a of the embodiment, the recesses R32a all extend from the bottoms of the trenches T31a to one of the etching stop layers 91. Similarly, in the first insulating layer 110b of the embodiment, the recesses R32b extend from the bottoms of the trenches T31b to the other etching stop layer 91. Thus, the recesses R32a, R32b and the trenches T31a, T31b can partially expose the surfaces of the etching stop layers 91 after etching the initial insulating layers 110. In other words, the bottom B32a of each of the recesses R32a is equivalent to the surface of one of the etching stop layers 91, and the bottom B32b of each of the recesses R32b is equivalent to the surface of the other etching stop layer 91.

Figure 12:
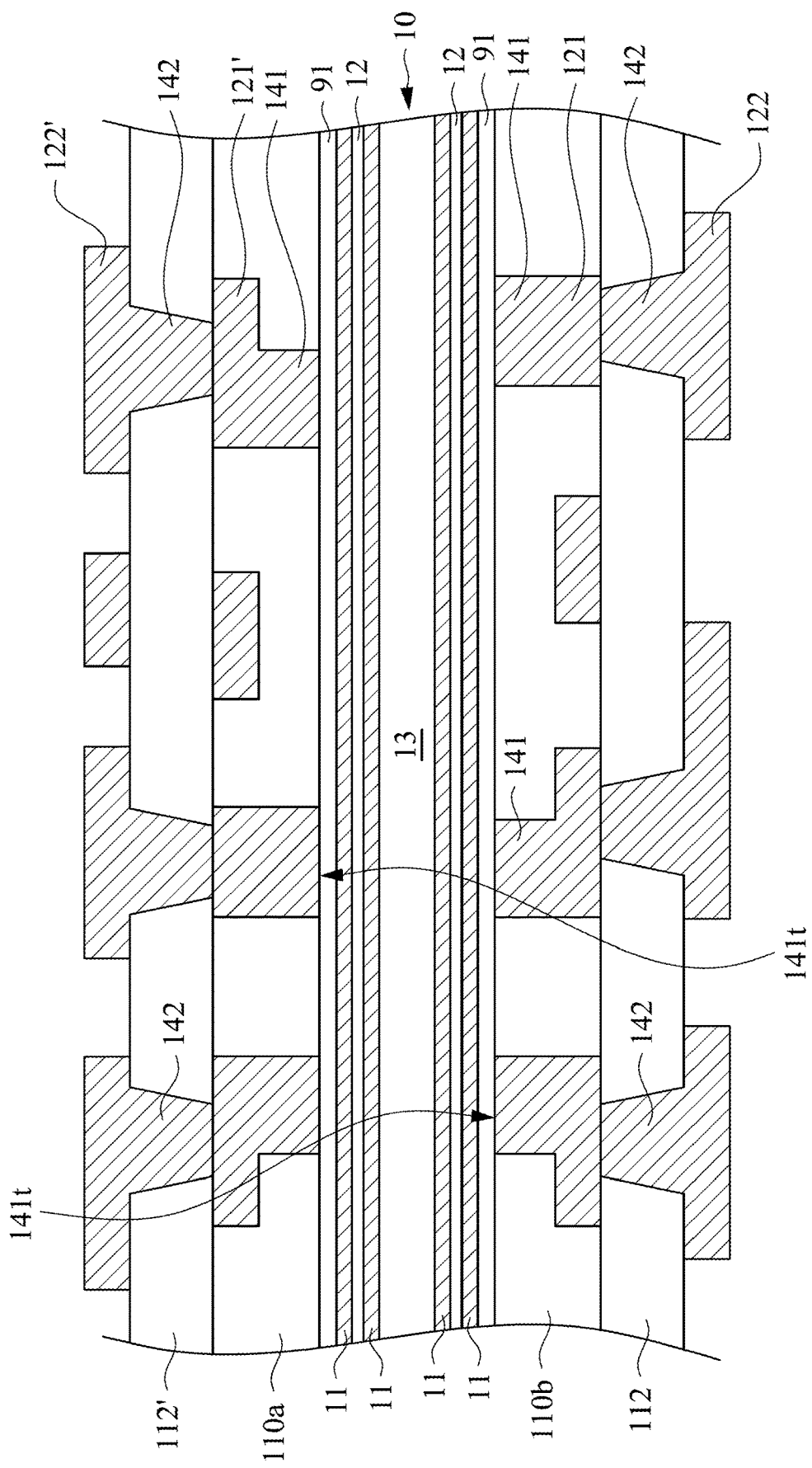

Referring to FIGS. 11 and 12, afterward, a plurality of first conductive columns 141 are formed in the recesses R32a and R32b, while the first wiring layers 121 and 121' are formed in the trenches T31a and T31b. The first conductive columns 141 are connected to the first wiring layers 121 and 121' respectively. Each of the first conductive columns 141 has an end face 141t, in which the end faces 141t of the first conductive columns 141 are located on the bottoms B32a and B32b of the recesses R32a and R32b respectively.

Since the recesses R32a and R32b extend to the etching stop layers 91 respectively, the end faces 141t are located on the etching stop layers 91. In other words, the first conductive columns 141 can extend to and touch the etching stop layers 91, and the etching stop layers 91 can cover the end faces 141t of the first conductive columns 141. Thus, each of the etching stop layers 91 can be located between the holding board 10 and the first conductive columns 141 and space each of the first conductive columns 141 from the metal layers 11, so that the first conductive columns 141 cannot touch the metal layers 11 directly. Next, two second insulating layers 112 and 112', two second wiring layers 122 and 122', and a plurality of the second conductive columns 142 are formed on the first wiring layers 121 and 121' respectively.

Figure 13:
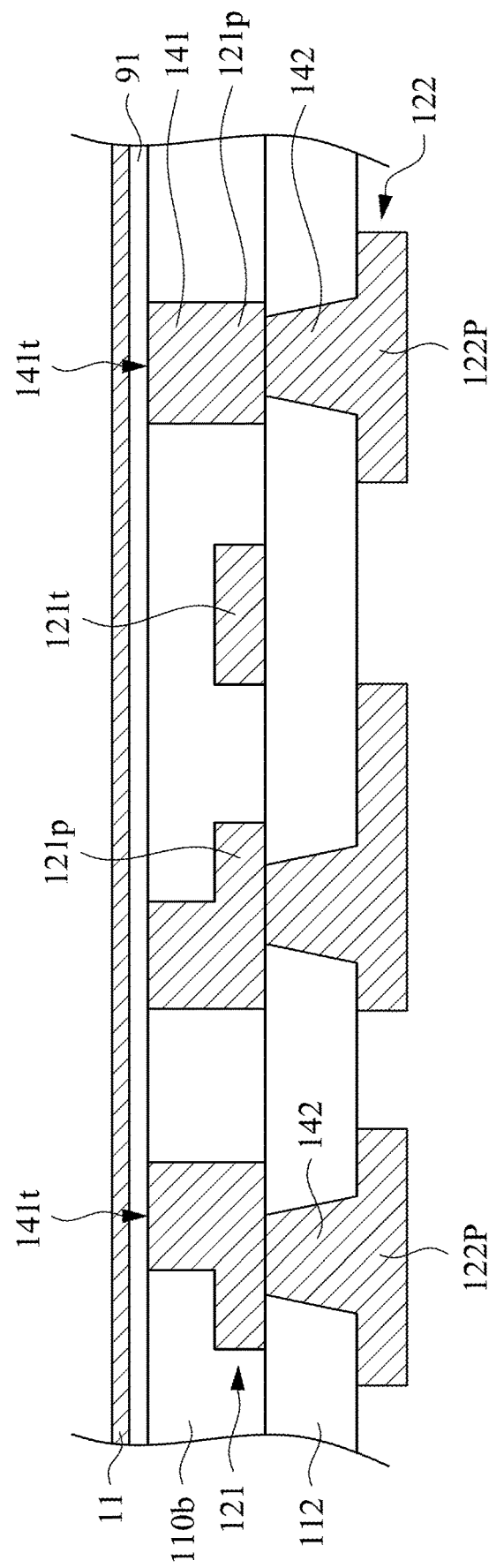

Referring to FIGS. 12 and 13, after the first conductive columns 141 and the first wiring layers 121, 121' are formed, the supporting substrate 13 and the metal layers 11 connected to the supporting substrate 13 are peeled off by using the release layers 12, so that the two metal layers 11 connected to the first insulating layers 110a and 110b can be separated from the supporting substrate 13, where FIG. 13 is illustrated with one film structure below the supporting substrate 13 shown in FIG. 12, for example, so as to describe the following processes. In addition, the following process can be performed on the other film structure above the supporting substrate 13 shown in FIG. 12 to make another wiring board.

Figure 14:
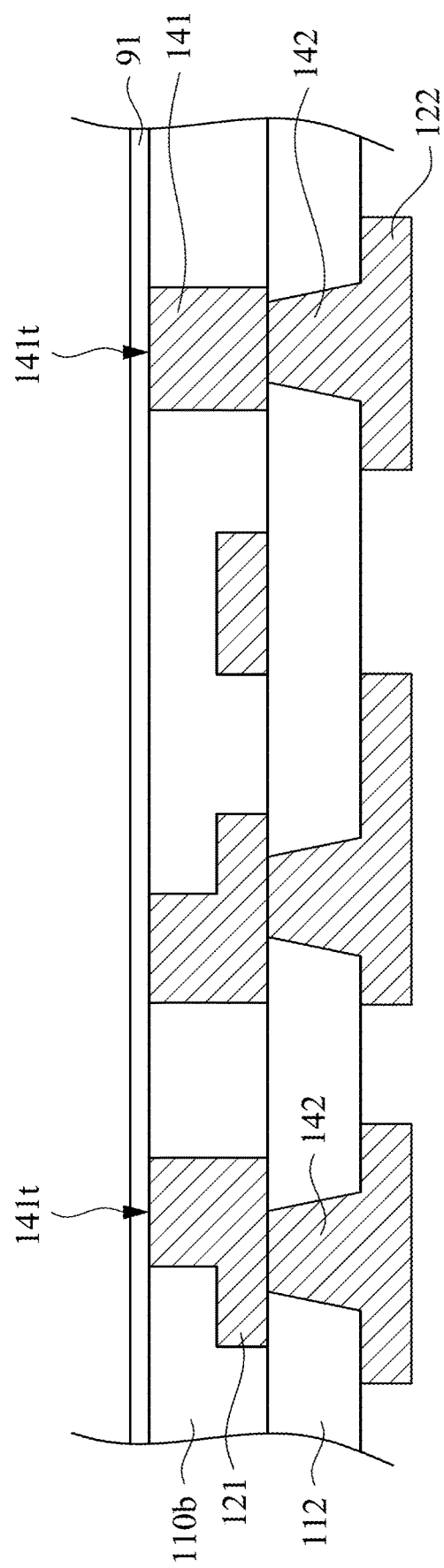

Referring to FIGS. 13 and 14, after peeling off the supporting substrate 13 and the metal layers 11 connected to the supporting substrate 13, the metal layer 11 connected to the etching stop layer 91 is removed, so as to expose the etching stop layer 91, in which the removal of the metal layer 11 can be etching or polishing. Since the etching stop layer 91 covers the end faces 141t, the etching stop layer 91 can protect the first conductive columns 141 from the etching media (e.g., etchant) in the process of removing the metal layer 11 by using etching. For example, the etching stop layer 91 can be a nickel layer, and the metal layer 11 can be copper layer, so the metal layer 11 can be removed by using sodium hydroxide as etching media. Since sodium hydroxide damages nickel difficultly, the etching stop layer 91 made of nickel can protect the first conductive columns 141 from sodium hydroxide.

Figure 15:
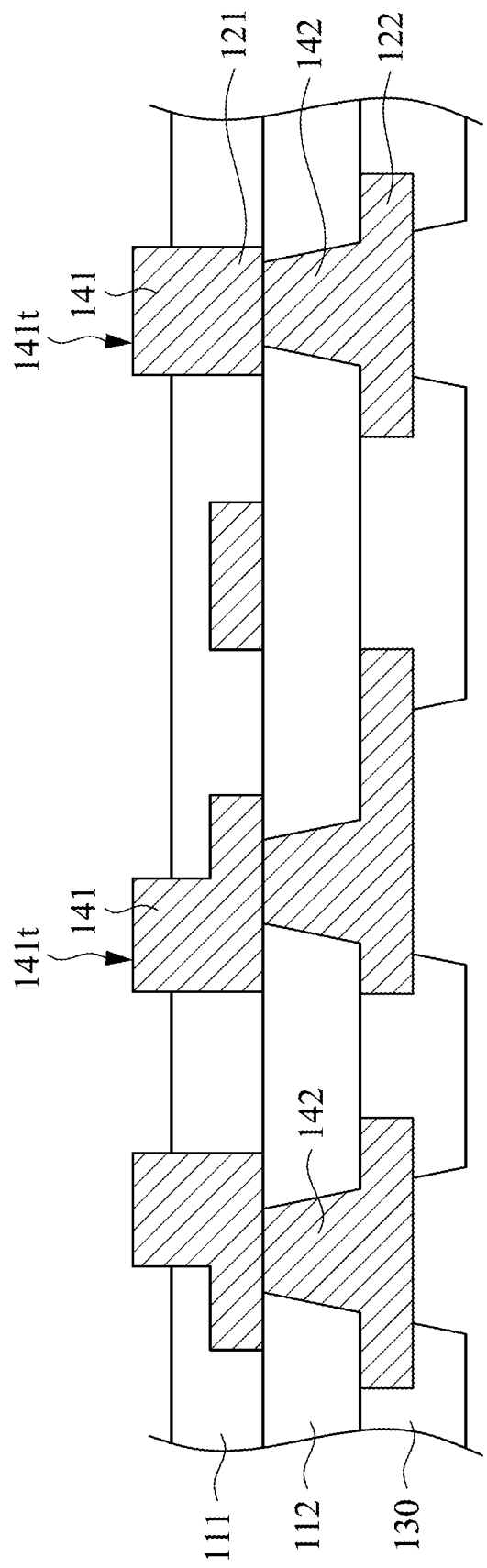

Referring to FIGS. 14 and 15, after removing the metal layer 11, the etching stop layers 91 are removed, so as to expose the end face 141t of each of the first conductive columns 141, where the removal of the etching stop layer 91 can be etching or polishing. Afterward, the part of the first insulating layer 110b adjacent to the first conductive columns 141 is removed, so that the first conductive columns 141 protrude from the surface of the first insulating layer 111. So far, the wiring board 100 is basically complete.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A wiring board, comprising:
a first insulating layer, having a first surface and a second surface opposite to the first surface;
a first wiring layer, disposed in the first insulating layer and having a third surface and a fourth surface opposite to the third surface, wherein the first insulating layer covers the third surface, and the second surface of the first insulating layer is flush with the fourth surface of the first wiring layer; and
a plurality of first conductive columns, disposed in the first insulating layer and connected to the first wiring layer, wherein the first conductive columns extends from the third surface of the first wiring layer to the first surface of the first insulating layer, and the first conductive columns protrude from the first surface.

2. The wiring board of claim 1, wherein each of the first conductive columns has a sidewall and an end face opposite to the third surface, wherein the sidewall is connected to an edge of the end face and extends from the edge of the end face to the first wiring layer, and each of the first conductive columns and the first wiring layer overlap to form an overlapping area,
wherein a width of the end face is equal to a width of the overlapping area in the same first conductive column.

3. The wiring board of claim 2, wherein a ratio of the width of the end face to the width of the overlapping area ranges between 0.7 and 1.

4. The wiring board of claim 2, wherein the sidewall of at least one of the first conductive columns is perpendicular to the third surface.

5. The wiring board of claim 2, wherein at least one part of the sidewall of the at least one of the first conductive columns is flush with at least one part of the sidewall of the first wiring layer.

6. The wiring board of claim 1, wherein the first conductive columns and the first wiring layer are integrally formed into one.

7. The wiring board of claim 1, further comprising:
a second wiring layer;
a second insulating layer, disposed between the first wiring layer and the second wiring layer; and
a plurality of second conductive columns, disposed in the second insulating layer and connected to the first wiring layer and the second wiring layer.

8. The wiring board of claim 7, wherein a width of each of the second conductive columns increases gradually from the first wiring layer to the second wiring layer.

9. A method of manufacturing a wiring board, comprising:
forming a first shade layer on an initial insulating layer, wherein the first shade layer has a first hollow pattern;
forming a second shade layer on the first shade layer, wherein the second shade layer has a second hollow pattern different from the first hollow pattern, and a part of the first hollow pattern and a part of the second hollow pattern overlap;
by using the first shade layer and the second shade layer as masks, etching the initial insulating layer, so as to form a first insulating layer having a plurality of recesses and a plurality of trenches, wherein the recesses are connected to the trenches, and the recesses extend from bottoms of the trenches in a direction away from the trenches;
depositing a conductive material in the recesses and the trenches, so as to form a plurality of first conductive columns in the recesses and to form a first wiring layer in the trenches; and
removing a part of the first insulating layer adjacent to the first conductive columns, so as to cause the first conductive columns to protrude from a surface of the first insulating layer.

10. The method of claim 9, further comprising:
providing a holding board, comprising:
a supporting substrate;
a plurality of metal layers, disposed on the supporting substrate, wherein one of the metal layers is connected to the supporting substrate; and
a release layer, disposed between two adjacent metal layers;
forming the initial insulating layer on the metal layers, wherein another of the metal layers is connected to the initial insulating layer;
after forming the first conductive columns and the first wiring layer, peeling off the supporting substrate and one of the metal layers connected to the supporting substrate by using the release layer, and remaining another of the metal layers connected to the first insulating layer; and
after peeling off the supporting substrate and the metal layer connected to the supporting substrate, removing the metal layer connected to the first insulating layer.

11. The method of claim 10, further comprising forming a conductive layer on the first insulating layer in a process of depositing the conductive material in the recesses and the trenches, wherein the conductive layer is connected to the first wiring layer, and the first wiring layer are located between the conductive layer and the first conductive columns, the method of manufacturing the wiring board further comprising:
before peeling off the supporting substrate and the metal layers connected to the supporting substrate, removing the conductive layer.

12. The method of claim 9, wherein each of the first conductive columns has an end face,
wherein the end faces of the first conductive columns are located on bottoms of the recesses, and a part of the first insulating layer covers the end faces of the first conductive columns before removing the part of the first insulating layer adjacent to the first conductive columns.

13. The method of claim 9, wherein the first shade layer is a metal pattern layer, and forming the first shade layer on the initial insulating layer comprises:
forming a metal layer on the initial insulating layer; and
patterning the metal layer.

14. The method of claim 13, wherein forming the metal layer on the initial insulating layer comprises adhering a metal foil on the initial insulating layer.

15. The method of claim 9, wherein the second shade layer is a photoresist pattern layer, and etching the initial insulating layer comprises:
by using the first shade layer as a mask, ashing the second shade layer and a part of the initial insulating layer.

16. The method of claim 9, further comprising:
after forming the first conductive columns and the first wiring layer,
forming a second insulating layer, a second wiring layer and a plurality of second conductive columns on the first wiring layer, wherein the second insulating layer is disposed between the first wiring layer and the second wiring layer, and the second conductive columns are disposed in the second insulating layer and connected to the first wiring layer and the second wiring layer.

17. The method of claim 9, further comprising:
providing a holding board, comprising:
a supporting substrate;
a plurality of metal layers, disposed on the supporting substrate, wherein one of the metal layers is connected to the supporting substrate; and
a release layer, disposed between two adjacent metal layers;
forming an etching stop layer and the initial insulating layer on the metal layers, wherein another of the metal layers is connected to the etching stop layer;
after forming the first conductive columns and the first wiring layer, peeling off the supporting substrate and one of the metal layers which is connected to the supporting substrate by using the release layer, and remaining another of the metal layers connected to the first insulating layer; and
after peeling the supporting substrate and the metal layer connected to the supporting substrate, removing the metal layer connected to the first insulating layer.

18. The method of claim 17, wherein the recesses extend from the bottoms of the trenches to the etching stop layer after etching the initial insulating layer.

19. The method of claim 18, wherein each of the first conductive columns has an end face, wherein before removing the part of the first insulating layer adjacent to the first conductive columns, the method further comprises:
removing the etching stop layer, so as to expose the end face of each of the first conductive columns.

* * * * *